United States Patent [19]
Olmstead et al.

[11] Patent Number: 5,287,068
[45] Date of Patent: Feb. 15, 1994

[54] COMPARATOR AMPLIFIER

[75] Inventors: John A. Olmstead, Cape May Court House; Salomon Vulih, Neshanic St., both of N.J.

[73] Assignee: Harris Corporation, Melbourne, Fla.

[21] Appl. No.: 936,596

[22] Filed: Aug. 27, 1992

[51] Int. Cl.$^5$ .......................... H03F 1/02; H03F 3/45
[52] U.S. Cl. ...................................... 330/9; 330/253; 330/260; 330/294
[58] Field of Search ................... 330/9, 110, 253, 260, 330/294

[56] References Cited

U.S. PATENT DOCUMENTS

| | | | |
|---|---|---|---|
| 4,320,347 | 3/1982 | Haque | 330/9 |
| 4,714,843 | 12/1987 | Smith | 330/9 X |
| 4,933,643 | 6/1990 | Jandu et al. | 330/9 |

FOREIGN PATENT DOCUMENTS 2157108  10/1985  United Kingdom ................... 330/9

Primary Examiner—James B. Mullins
Attorney, Agent, or Firm—Henry I. Schanzer; Ferdinand Romano; C. C. Krawczyk

[57] ABSTRACT

An amplifier includes first and second amplifying stages with the first amplifying stage having an inverting input, a non-inverting input and an intermediate output node at which is produced a signal responsive to signals applied to the inverting and non-inverting inputs. The second amplifying stage has an input connected to the intermediate output node and an output connected to an amplifier output terminal. A selectively enabled transmission gate is connected in series with a capacitor between the input and the output of the second amplifying stage. The selectively enabled transmission gate means, when enabled, functions as a resistance which in combination with the capacitor provides frequency compensation for the amplifier. When the transmission gate is disabled, it functions to disconnect one side of the capacitor and eliminates its loading effect on the amplifier stage.

14 Claims, 3 Drawing Sheets

COMPARATOR AMPLIFIER

BACKGROUND OF THE INVENTION

This invention relates to amplifier circuits and, in particular, to amplifier circuits intended to be operated in two different modes.

In certain applications such as switched capacitor systems, an amplifier, functioning as a comparator used to detect the difference between two signals, is normally operated in two modes. In the first mode, also termed herein the "initialization" or "auto-zero" phase, offset voltages are determined and stored and applied to the input(s) of the amplifier which are preset to some initial states and/or reference levels. This is better explained by reference to FIG. 1 which shows a prior art auto-zeroed comparator circuit.

An operational amplifier A1 which is a high gain amplifier has an inverting input 11, a non-inverting input 13, and an output terminal 101. For ease of discussion, the amplifier A1 of FIG. 1 is shown to include two amplifying stages 103 and 105. The first stage 103 is a differential input stage connected to inputs 11 and 13 and has an output 104 connected to the input of a second amplifying stage 105 whose output is connected to output terminal 101. A feedback compensation network comprised of a resister R1 and a capacitor C1 is connected between the input and output of the second amplifying stage 105.

A feedback switch S1 is connected between output terminal 101 and inverting input node 11. When S1 is closed (enabled) it provides a low impedance conduction path between the output terminal 101 and input node 11. Offset voltages produced when S1 is closed are stored at node 11. When S1 is closed, it is necessary that amplifier A1 be stable. To meet this requirement, the components R1 and C1 of the feedback compensation network are selected and designed to ensure that amplifier A1 is stable. To satisfy the stability criteria, the feedback combination of R1 and C1 lowers the gain of the amplifier at the higher frequencies and lowers the bandwidth to avoid oscillations.

Thus the values of R1 and C1 are selected such that during the mode auto-zero of operation amplifier A1 with switch S1 closed functions as a unity gain, stable, operational amplifier.

In the second mode of operation also referred to herein as the "amplifying" mode the switch S1 is opened and input signals are applied to the amplifier. In FIG. 1, capacitors CA1 and CA2 are connected to terminal 11 to couple different signals to be compared while a reference voltage VREF is applied to input 13. During the amplifying mode it is required that the amplifier respond as quickly as possible to very small signal variations. To meet this requirement, the amplifier must have high gain at high frequencies and must have a wide bandwidth. However, the presence of R1 and C1 limit the gain and the frequency response of the circuit.

In circuits known to applicants, as shown in FIG. 2, the resistance R1 may be formed by connecting the conduction paths of two complementary transistors in parallel; one transistor NA being of N-conductivity type and the other PA being of P-conductivity type. The gate of the P-type transistor (PA) is permanently connected to ground and the gate of the N-type transistor (NA) is permanently connected to the positive power supply, VDD. The sizes of the P- and N-type transistors are selected to provide the desired value of resistance for R1 and since the gates of the transistors are permanently connected to ground and VDD, the resistance R1 is permanently connected in the circuit.

As noted above, the R1-C1 network, connected to the amplifier provides compensation to ensure that the amplifier is in a stable condition during the auto-zero mode of operation. However as also noted the R1-C1 network presents a significant problem in that it limits the gain, the high frequency response, and the bandwidth during the signal amplifying operating mode.

The problem discussed above is resolved in circuits embodying the invention.

SUMMARY OF THE INVENTION

Applicants' invention resides in part in the recognition that the conflicting requirements and needs of the amplifier system may be resolved by connecting a desired R1-C1 network across an amplifier stage during the auto-zero phase and by disconnecting the RC network from the amplifier stage when it is to be operated in its high gain, high speed, amplifying mode.

Applicants' invention also resides in the recognition that the resistor R1 of the RC network may be formed using the conduction path of a transistor operated as a transmission gate and that the transistor may be switched on and off. In the auto-zero phase mode, the transmission gate transistor is enabled with its conduction path defining an impedance R1 in series with a capacitor C1 connected between the input and output of an amplifying stage. In the signal amplifying mode the transmission gate transistor is turned off disconnecting the capacitor C1 and removing the negative capacitor feedback from the amplifier stage. Although C1 is disconnected from the amplifier during the amplifying mode it retains and stores the charge developed across it during the auto zero phase until the next auto zero step. Thus, when the next auto zero phase occurs the amplifier attains the correct stable value in less time since the capacitor does not have to be recharged from a totally discharged value.

In a particular circuit embodying the invention, two transistors, operated as a selectively enabled transmission gate, are connected in series with a capacitor between the input and output of an amplifier stage. When the two transistors are turned-on they function as a compensation resistor to make an operational amplifier of which the amplifier stage is a part unity gain stable. When the two transistors are turned-off they disconnect one side of the capacitor and enable the operational amplifier of which the amplifier stage is a part to function as a high speed broad band comparator. Also, the capacitor, although disconnected, is not discharged whereby it retains it's precharge (auto-zero) value enabling a subsequent auto zeroing cycle to stabilize faster.

DETAILED DESCRIPTION OF THE INVENTION

Figure 1:
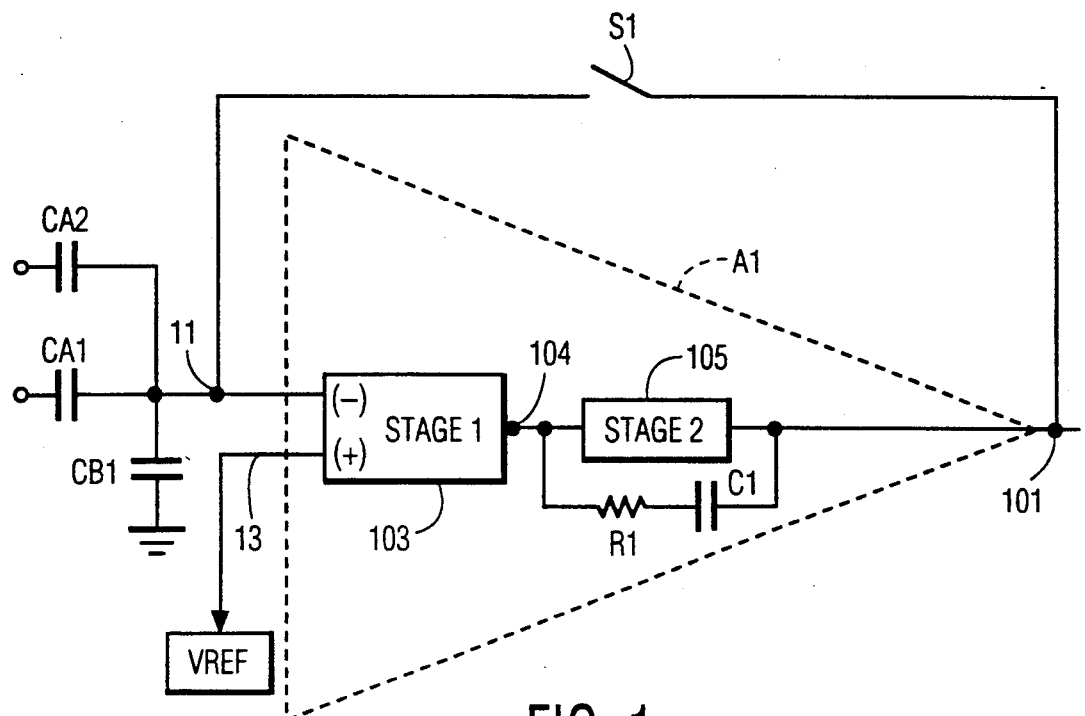
FIG. 1 is a partial block, partial schematic diagram of a prior art comparator.
Figure 2:
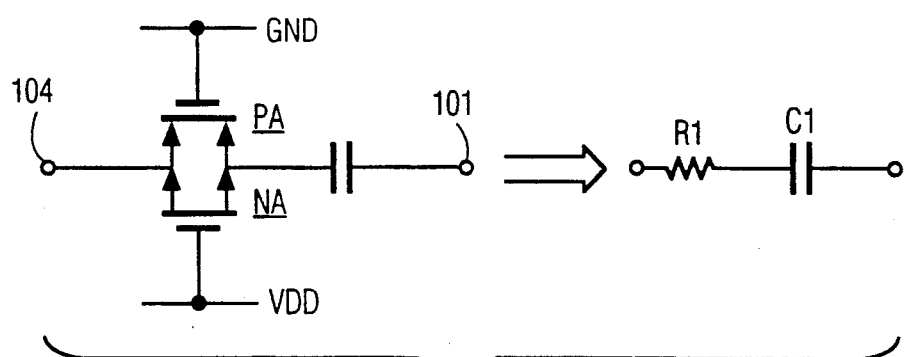
FIG. 2 is a schematic diagram of a prior art resistive capacitor network.

Insulated-gate field-effect transistors (IGFETs) are the active devices preferred for use in practicing the invention. For this reason, the circuit is illustrated in the drawing as employing such transistors and will be so described hereinafter. However, this is not intended to preclude the use of other suitable devices and to this end, the term "transistor" when used without limitation in the appended claims, is used in a generic sense.

In the FIGUREs, enhancement type IGFETs of P-conductivity type are identified by the letter P followed by a particular reference character; and enhancement type IGFETs of N-conductivity type are identified by the letter N followed by a particular reference character. The characteristics of IGFETs are well known and need not be described in detail. But, for a clearer understanding of the description to follow, definition and characteristics of IGFETs pertinent to the invention are set forth below.

1. IGFETs have a first electrode and second electrode referred to as the source and drain defining the ends of a conduction path, and a control electrode (gate) whose applied potential determines the conductivity of the conduction path. For a P-type IGFET the source electrode is defined as that electrode of the first and second electrode having the highest potential applied thereto. For an N-type IGFET, the source electrode is defined as that electrode of the first and second electrodes having the lowest potential applied thereto.

2. The IGFETs used are bidirectional in the sense that when an enabling signal is applied to the control electrode, current can flow in either direction in the conduction path defined by the first and second electrodes.

3. For conduction to occur, the applied gate-to-source potential (Vgs) must be in a direction to turn-on the transistor and must be greater in magnitude than a given value which is defined as the threshold voltage (Vt). Thus, where the applied Vgs is in a direction to forward bias the transistor but is lower in amplitude than Vt the transistor remains cut off and there is substantially no current flow in the conduction channel.

4. When used as a source follower, the voltage at the source electrode (Vs) "follows" the signal applied at the gate (Vg) but is offset with respect to the gate by a voltage whose amplitude is equal to the threshold voltage (Vt) of the device (Vs=Vg−Vt).

5. In the drawings, P-type IGFETs are sometimes identified by an arrow on the source leg pointing towards the channel of the IGFET and/or by an arrow on the body pointing away from the channel. N-type IGFETs are sometimes identified by an arrow on the source leg pointing away from the channel of the IGFET and/or by an arrow on the body pointing towards the channel of the IGFET.

Figure 3:
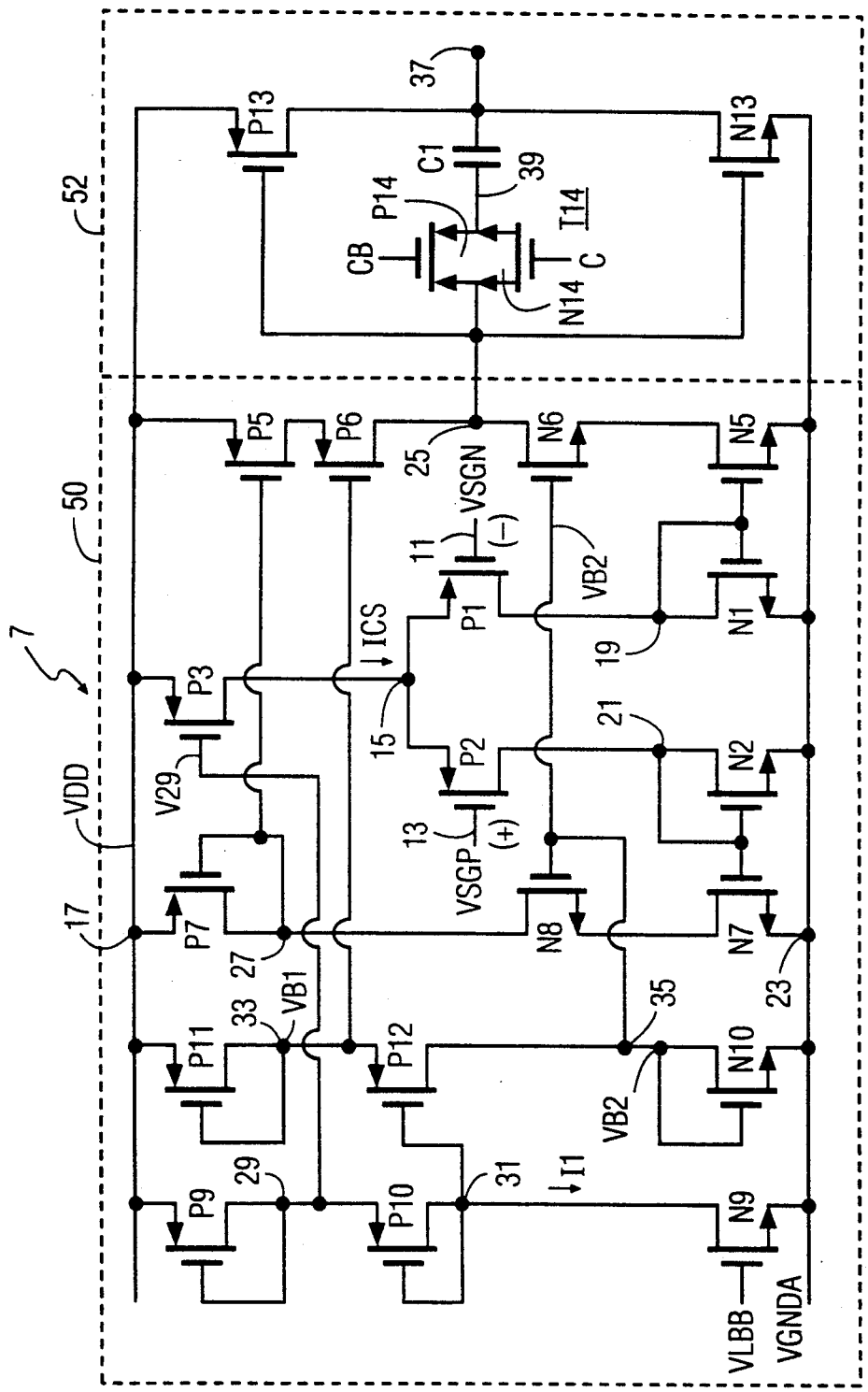
FIG. 3 is a schematic diagram of an amplifier embodying the invention.

Referring to FIG. 3 an amplifier 7 embodying the invention is shown to include a first amplifying section 50 and an output amplifying section 52.

The first section 50 of FIG. 3 incldes an input differential amplifier stage comprised of transistors P1, P2, P3, N1 and N2. The gate electrode of P1 is connected to an input terminal 11 which defines the inverting input node of amplifier 7 and the gate of P2 is connected to an input terminal 13 which defines the non-inverting input node of the amplifier. The sources of P1 and P2 are connected in common to a node 15. The conduction path of P3 is connected between node 15 and power terminal 17 to which is applied an operating potential of VDD volts. A bias potential V29 whose generation is detailed below, is applied to the gate of P3 whereby it functions as a relatively constant current source supplying a current ICS into node 15.

The drain of P1 is connected to the drain and gate of N1 at node 19 which defines one output of the differential amplifier and the drain of P2 is connected to the drain and gate of N2 at node 21 which defines another output of the differential amplifier. The sources of N1 and N2 are connected to ground terminal 23. The differential signal produced at node 19 is directly coupled to the gate of N5 while the differential signal produced at node 21 is coupled via a level shifting network to the gate of P5, as detailed below.

The gate and drain of N1 are connected to the gate of N5 whereby the signal at node 19 is directly applied to the gate of N5. The source of N5 is grounded and its drain is connected to the source of a transistor N6 whose drain is connected to a node 25, which defines the output node of stage 50.

The signal at node 21 gets coupled to the gate of P5 by means of the following connections. The gate and drain of N2 are coupled to the gate of a transistor N7 whose source is grounded and whose drain is connected to the source of a transistor N8. The drain of transistor N8 is connected to the gate and drain of a transistor P7 and to the gate of P5 at a node 27. Transistors N7 and N8 as detailed below function to level shift the signal at node 21 onto the gate of P5. The source of a transistor P6 is connected to the drain of P5 and the drain of P6 is connected to intermediate output node 25. P5 and P6 are interconnected to form a cascode arrangement to supply, or source, a current into stage 50 output node 25 and N5 and N6 are interconnected to form a cascode arrangement to sink, or draw, a current out of node 25.

To set up an initial symmetric condition, a bias network produces the bias voltage VB1 applied to the gate of P6 and the bias voltage VB2 applied to the gates of transistors N8 and N6.

The bias network includes transistors P9, P10, P11, P12, N9 and N10. The source of P9 is connected to terminal 17 and its gate and drain are connected to the gate of P3 at node 29. The voltage drop across P9 establishes a fixed bias applied to the gate of P3 and the conduction level through P3.

The source of P10 is connected to node 29 and its gate and drain are connected to a node 31. The drain-to-source path of a transistor N9 is connected between node 31 and ground. An external control voltage VLBB is applied to the gate of N9. VLBB controls the condition through N9 and the current level (I1) through P9 and P10 and hence the voltage (V29) at node 29 and the voltage (V31) at node 31.

The gate and drain of P10 are connected to the gate of P12. The source of P12 is connected to the gate and drain of P11 at node 33 at which is generated a bias voltage VB1 applied to the gate of P6. The drain of P12 is connected to the gate and drain of N10 at node 35 at which is generated a bias voltage VB2 applied to the gates of N8 and N6. The source of N10 is grounded and the source of P11 is returned to VDD volts.

The operation of amplifying stage 50, which functions as a transconductance amplifier, is known and need not be discussed in great detail. For the condition of equal voltages applied to input nodes 11 and 13, the voltage at node 25 should be equal to Vcc/2 as can be demonstrated from the following analysis.

For the condition of equal voltages being applied to the gates of P1 and P2 (i.e., V11=V13), a current equal to ICS/2 flows through P1 and N1 and through P2 and N2. Assuming further that N5, N7, N1 and N2 have the same geometries, the currents mirrored in N5 and N7 will be equal to ICS/2. Thus a current ICS/2 flowing in N5 is drawn or sunk out of node 25. Concurrently, the current ICS/2 flowing through N7 will be drawn through N8 and P7. The current ICS/2 flowing through P7 causes a voltage drop at node 27 which is applied to the gate of P5. Assuming P5 to have the same geometry as P7 the current ICS/2 in P7 is mirrored in P5 whereby P5 sources a current equal to ICS/2 into node 25. In the biasing network the voltage at node 31 applied to the gate of P11 causes a current I2 to flow through P12 and P11, this current generates the bias voltage VB1 applied to the gate of P6 and the bias voltage VB2 applied to the gate of N6. Therefore, for a balanced input V11=V13, the output at node 25 should be equal to Vcc/2.

Amplifier stage 50 and its biasing circuit functions as a high gain transconductance amplifier stage producing a single ended output at node 25 in response to a differential signal applied between nodes 11 and 13.

When V11 goes high relative to V13, conduction through N1 decreases, V19 goes low and there is decreasing conduction in N5 and less current is drawn or sunk out of node 25. Concurrently, conduction through N2 increases and V21 increases increasing conduction through N7, N8 and P7. The increased conduction through P7 is mirrored in P5 whose increased conduction causes more current to flow into node 25.

When V11 goes low relative to V13 a complementary condition to the one described above occurs. Thus, amplifying stage 50 functions as a high gain stage producing amplified signals at node 25 which are the inverse of those applied to input 11 and in-phase with those applied to input 13.

The signals at node 25 are coupled to the input of amplifier stage 52.

The output stage 52 of amplifier 7 includes transistors P13 and N13, transmission gate transistors P14 and N14, and a capacitor C1.

P13 is connected at its source to terminal 17, at its gate to intermediate node 25, and at its drain to output terminal 37. N13 is connected at its source to terminal 23 at its gate to node 25 and at its drain to output terminal 37. Where P3 and N3 are metal oxide semiconductor IGFETs, they form what is known in the art as a complementary MOS (CMOS) inverter.

The source-to-drain paths of transistors P14 and N14 are connected in parallel between intermediate node 25 and node 39 to which is also connected one side of a capacitor C1. The other side of C1 is connected to output terminal 37. A control voltage C is applied to the gate of N14 and the logical complement (or inverse) of the control voltage C, denoted as CB, is applied to the gate of P14.

Figure 4A:
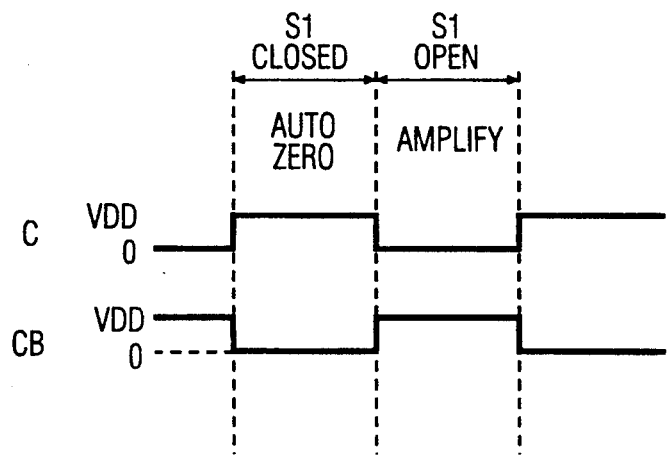
FIG. 4A is a diagram of control voltages applied to transistor N14 and P14 in FIGS. 3 and 4B.

Circuits embodying the invention define over the prior art in that the control signals C and CB applied to the gates of N14 and P14, respectively, control the turn-on and turn-off of N14 and P14. The C and CB signals shown in waveforms C and CB of FIG. 4A are applied to the gate of N14 and P14, respectively.

When C is "high" (VDD) and CB is "low" (ground) transistor N14 and P14 are turned-on. When C is "low" (zero) and CB is "high" (VDD), N14 and P14 are turned-off. Normally N14 and P14 are turned-on when the switch S1 shown connected between node 37 and input 11 in FIG. 4B is closed (auto-zero) and N14 and P14 are turned-off when S1 is open (amplifying mode).

Figure 4B:
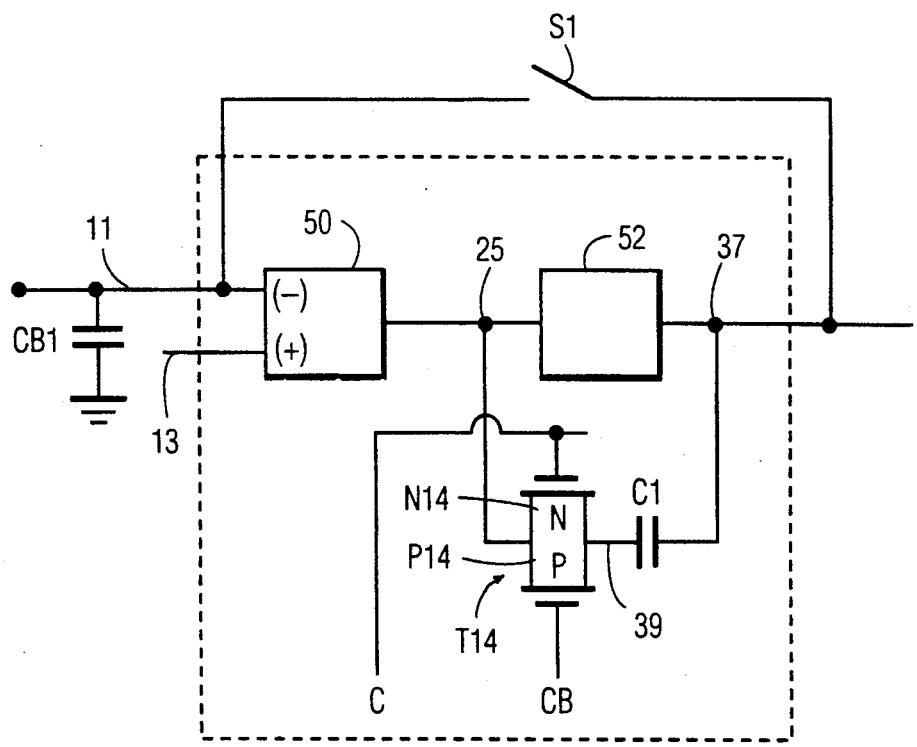
FIG. 4B is a block diagram of a comparator embodying the invention.

Referring to FIG. 4B, S1 is connected between terminal 37 and input node 11, as shown in FIG. 4B. During the auto-zero phase switch S1 is closed (enabled) concurrently with the turn-on (closure) of transmission gate T14, comprised of transistors N14 and P14. Any offset voltage generated at the output terminal 37 is coupled via switch S1 to the input 11 and stored on nodal capacitance CB1.

Referring back to FIG. 3, in circuits and systems embodying the invention, transistors P14 and N14 are designed to have a predetermined impedance when biased in the on condition which occurs when the gate of P14 is driven to ground (low) potential and the gate of N14 is driven to VDD (high) volts.

That is, when the signal C set to VDD is applied to the gate of N14 and when the signal CB set at ground potential is applied to the gate of P14, the conduction paths of P14 and N14 exhibit a certain impedance. This impedance is a function of the geometry of the transistors as well as their gate-to-source bias. Their ON impedance (i.e., R1) is designed to have a value which in combination with C1 causes the amplifier 7 to be stable during the auto-zero phase; (i.e., when S1 shown in FIG. 4B is closed). The ON impedance (R1) will vary as a function of the voltage at node 25. However this is factored into the sizing of the transistors.

Thus during the auto-zero mode of operation the resistance of transistors P14 and N14 function as an equivalent resistance R1 in series with C1. As discussed above during the auto-zero phase, transistors P14, N14, and C1 function to form as a negative feedback network to stabilize the operation of the amplifier.

During an amplifying mode, transistors P14 and N14 are turned off by the application of VDD to the gate of P14 and ground to the gate of N14. P14 and N14 now function as open switches whereby C1 is no longer connected in circuit with the amplifier. Thus the loading effect of capacitor C1 is eliminated and the full gain of the amplifier is available to amplify the signals at node 25. This is significant because when C1 is connected in circuit, C1 loads node 25 lowering the gain of the transconductance portion as well as lowering the gain of the inverter stage.

Thus transistors P14 and N14 function as resistors and as part of a feedback network when the transistors are turned-on and function to decouple the feedback network from loading the amplifying stage when they are turned off.

Another aspect of the invention is that during the auto phase period with S1 closed, capacitor C1 will be charged to some value. When transistors P14 and N14 are turned off, the side of C1 connected to terminal 39 floats. Hence the charge stored on capacitor C1 will remain stored on C1, even though the side of capacitor C1, connected to output terminal 37, follows the signal at that terminal. Furthermore, when N14 and P14 are turned-on again the offset voltage which will normally be very close to the value already stored on C1 will be quickly reestablished. This will enable the auto zero period to be shorter than in prior art circuits.

Therefore circuits embodying the invention include means for enabling an amplifier to be conditionally stable during an auto-zero phase and to have a high-gain, high frequency response during the amplifying mode.

What is claimed is:

1. An amplifier comprising:

first and second amplifying stages;

said first amplifying stage having an inverting input, a non-inverting input and an intermediate output node at which is produced a signal responsive to signals applied to said inverting and non-inverting inputs;

said first amplifying stage including a differential amplifier stage having first and second inputs respectively connected to said inverting input and non-inverting input, said differential amplifier stage having first and second differential output nodes, said first amplifying stage also including a first branch coupled to and responsive to the signal at one of said differential output nodes for supplying a current into said intermediate node, and a second branch coupled to and responsive to the signal at the other one of said differential output nodes for drawing a current out of said intermedite node;

said second amplifying stage having an input connected to said intermediate output node and an output connected to an output terminal; and a selectively enabled transmission gate means connected in series with a capacitor between said input and said output of said second amplifying stage; said selectively enabled transmission gate means, when enabled, functioning as a resistance which in combination with the capacitor provides frequency compensation, and when disabled, functioning to disconnect one side of the capacitor and eliminating its loading effect on the amplifier stage whereby the amplification of said second amplifier stage is substantially greater than 1.

2. The combination as claimed in claim 1 wherein said selectively enabled transmission gate means includes a first transistor having first and second electrodes defining the ends of a conduction path and a control electrode;

wherein one end of the conduction path of said first transistor is connected to said input of said second amplifying stage and the other end of the conduction path of said first transistor is connected to one side of said capacitor; and wherein the other side of said capacitor is connected to the output of said second amplifying stage at said output terminal.

3. The combination as claimed in claim 1 wherein said selectively enabled transmission gate includes first and second transistors, of complementary conductivity type, each transistor having first and second electrodes defining the ends of a conduction path and a control electrode;

wherein the conduction paths of said first and second transistors are connected in parallel between the input of said second amplifying stage and one side of said capacitor; and wherein the other side of said capacitor is connected to the output of said second amplifying stage.

4. The combination as claimed in claim 3 wherein said transistors are insulated-gate field-effect transistors (IGFETs).

5. The combination as claimed in claim 3 wherein said second amplifying stage includes first and second insulated-gate field-effect transistors (IGFETs) of complementary conductivity type, each transistor having a gate, a source, and a drain; and wherein the gates of said first and second IGFETs are connected the input of said second amplifying stage, their drains are connected to the output of said second amplifying stage, and the source of said first IGFET is connected to a first point of operating potential and the source of said second IGFET is connected to a second point of operating potential.

6. The combination as claimed in claim 3 wherein said selectively enabled transmission gate means includes control means coupled to the control electrodes of said first and second transistors for turning them both on when the transmission gate is enabled and turning them both off when the transmission gate is disabled.

7. The combination as claimed in claim 1 wherein said amplifier includes a selectively enabled switch means coupled between the output of said second amplfying stage and the inverting input of said first amplifying stage.

8. The combination as claimed in claim 7 wherein said selectively enabled switch means and said selectively enabled transmission gate means are enabled concurrently and are disabled concurrently.

9. The amplifier as claimed in claim 1
wherein said first branch includes first and second transistors of first conductivity type having their conduction paths connected in series between a first power terminal and said intermediate and said second branch includes third and fourth transistors of opposite conductivity type having their conduction paths connected in series between said intermediate node and a second power terminal.

10. The amplifier as claimed in claim 9
wherein the control electrode of said first transistor of said branch is coupled to said one differential output node;

wherein the control electrode of said third transistor of said second branch is coupled to said other one of said differential output nodes; and wherein first and second relatively fixed bias signals are applied to the control electrodes of said second transistor of said first branch and to the fourth transistor of said second branch.

11. The combination comprising:

first and second amplifying stages;

said first amplifying stage having an inverting input, a non-inverting input and an intermediate output node at which is produced a signal responsive to signals applied to said inverting and non-inverting inputs;

said first amplifying stage including a differential amplifier stage having first and second inputs respectively connected to said inverting input and non-inverting input, said differential amplifier stage having first and second differential output nodes, said first amplifying stage also including a first branch coupled to and responsive to the signal at one of said differential output nodes for supplying a current into said intermediate node and a second branch coupled to and responsive to the signal at the other one of said differential output nodes for drawing a current out of said intermedite node;

said second amplifying stage having an input connected to said intermediate output node and an output connected to an output terminal;

a selectively enabled transmission gate means connected in series with a capacitor between said input and said output of said second amplifying stage; said selectively enabled transmission gate means, when enabled, functioning as a resistance which in combination with the capacitor provides frequency compensation, and when disabled, functioning to disconnect one side of the capacitor and eliminating its loading effect on the amplifier stage whereby the amplification of said second amplifier stage is substantially greater than 1; and selectively enabled switch means connected between said output terminal and the inverting means of said first amplifying stage.

12. The combination as claimed in claim 11 wherein, said selectively enabled switch means and said selectively enabled transmission gate means are enabled concurrently enabled and concurrently disabled.

13. The combination as claimed in claim 12 wherein said first branch includes first and second transistors of first conductivity type having their conduction paths connected in series between a first power terminal and said intermediate and said second branch includes third and fourth transistors of opposite conductivity type having their conduction paths connected in series between said intermediate node and a second power terminal.

14. The combination as claimed in claim 13
wherein the control electrode of said first transistor of said branch branch is coupled to said one differential output node;

wherein the control electrode of said third transistor of said second branch is coupled to said other one of said differential output nodes; and wherein first and second relatively fixed bias signals are applied to the control electrodes of said second transistor of said first branch and to the fourth transistor of said second branch.

* * * * *